US006169419B1

(12) United States Patent
De et al.

(10) Patent No.: US 6,169,419 B1
(45) Date of Patent: Jan. 2, 2001

(54) METHOD AND APPARATUS FOR REDUCING STANDBY LEAKAGE CURRENT USING A TRANSISTOR STACK EFFECT

(75) Inventors: Vivek K. De, Beaverton; Yibin Ye, Portland, both of OR (US)

(73) Assignee: Intel Corporation, Santa Clara, CA (US)

(*) Notice: Under 35 U.S.C. 154(b), the term of this patent shall be extended for 0 days.

(21) Appl. No.: 09/151,177

(22) Filed: Sep. 10, 1998

(51) Int. Cl.[7] ............................................... H03K 19/0948

(52) U.S. Cl. ................................ 326/58; 326/34; 326/50; 326/121

(58) Field of Search ................................ 326/112, 119, 326/121, 83, 49–50, 31, 34, 57–58

(56) References Cited

U.S. PATENT DOCUMENTS

| | | | |
|---|---|---|---|
| 4,894,558 | * 1/1990 | Conkle et al. | 326/121 |
| 5,107,230 | 4/1992 | King . | |
| 5,216,289 | 6/1993 | Hahn et al. . | |
| 5,491,429 | * 2/1996 | Gasparik | 326/121 |
| 5,537,060 | 7/1996 | Baek . | |
| 5,614,847 | * 3/1997 | Kawahara et al. | 326/121 |
| 5,617,043 | 4/1997 | Han et al. . | |
| 5,751,651 | * 5/1998 | Ooishi | 326/121 |
| 5,773,999 | 6/1998 | Park et al. . | |
| 5,852,579 | 12/1998 | Arcoleo et al. . | |
| 5,877,647 | 3/1999 | Vajapey et al. . | |
| 5,889,415 | * 3/1999 | Parkinson | 326/83 |

OTHER PUBLICATIONS

Thompson, et al.; "Dual Threshold Voltages and Substrate Bias: Keys to High Performance, Low Power, 0.1 um Logic Designs"; *1997 Symposium on VLSI Technology Digest of Technical Papers*; Jan. 1997; pp. 69–70.

Kawaguchi, et al.; "A CMOS Scheme for 0.5V Supply Voltage with Pico–Ampere Standby Current"; IEEE International Solid–State Conference; Paper FP 12.4; Jan. 1998; pp. 192–193.

Mutoh, et al.; "1–V Power Supply High–Speed Digital Circuit Technology with Multithreshold–Voltage CMOS"; *IEEE Journal of Solid State Circuits*; vol. 30 No. 8 Aug. 1995; pp. 847–854.

Halter, et al.; "A Gate–Level Leakage Power Reduction Method for Ultra–Low–Power CMOS Circuits"; IEEE Custom Integrated Circuit Conference; Aug. 1997; 4 pages.

Kuroda, et al.; "A 0.9–V, 150–MHz, 10–mW, 4mm$_2$, 2–D Discrete Cosine Transform Core Processor with Variable Threshold–Voltage (VT) Scheme"; *IEEE Journal of Solid–State Circuits*, vol. 31, No. 11, Nov. 1996; pp. 1770–1779.

* cited by examiner

Primary Examiner—Jon Santamauro
(74) Attorney, Agent, or Firm—Cynthia T. Faatz

(57) ABSTRACT

Reduction of standby leakage current in an internal circuit block using a transistor stack effect. For one embodiment, an apparatus includes a standby leakage reduction circuit to be coupled to the circuit block including a plurality of logic gates. The standby leakage reduction circuit causes a stack effect at each of the plurality of logic gates during a standby mode of the circuit block by turning off two or more series-coupled transistors of a same type (either n-type or p-type) at each of the plurality of logic gates.

26 Claims, 6 Drawing Sheets

METHOD AND APPARATUS FOR REDUCING STANDBY LEAKAGE CURRENT USING A TRANSISTOR STACK EFFECT

RELATED APPLICATIONS

This application is related to copending application Ser. No. 09/150,869 entitled A Method and Apparatus for Reducing Standby Leakage Current Using Input Vector Activation, filed Sep. 10, 1998, and assigned to the assignee of the present application.

BACKGROUND

1. Field

An embodiment of the present invention relates to integrated circuits, and more particularly, to a method and apparatus for reducing standby leakage current using a transistor stack effect.

2. Discussion of Related Art

With the scaling of semiconductor process technologies, threshold voltages of metal oxide semiconductor circuits are typically being reduced with reductions in supply voltages in order to maintain circuit performance. Lower transistor threshold voltages lead to significant increases in leakage current due to the exponential nature of sub-threshold conductance. Higher leakage currents increase power dissipation which is undesirable for many semiconductor circuit applications. Higher leakage currents can be particularly problematic for mobile and handheld applications, for example.

One approach to addressing this issue has been to use dual threshold voltage and/or substrate bias techniques. In a dual threshold voltage approach, certain devices on a particular integrated circuit are designed and fabricated to have a first, low threshold voltage, while other devices on the same integrated circuit are designed and fabricated to have a second, higher threshold voltage. In this manner, devices that cannot tolerate the higher leakage current characteristic of lower threshold voltages can be selected to have higher threshold voltages.

The leakage reduction provided by this approach, however, is limited. This is because the lower threshold devices still exhibit the higher leakage current characteristic of such devices.

Where a substrate bias technique is used, during an active mode, a control circuit applies a voltage to transistor bodies to zero- or reverse-bias the bodies with respect to the transistors. Upon entering a standby mode, the control circuit changes the substrate bias voltage to cause a reverse bias or deepen an existing reverse bias in the transistor bodies. In this manner, the threshold voltage of the transistors are increased during a standby mode to reduce or cut off leakage current.

A disadvantage of this approach is that a large change in body bias is required to change the transistor threshold voltages by even a small amount. Further, when changing from active mode to standby mode and vice versa, large capacitances in transistor wells are switched from one voltage to another. Thus, significant power is dissipated during each mode transition. An increase in design complexity may also result from implementing such a substrate bias technique.

In a paper presented at the IEEE Custom Integrated Circuit Conference in August of 1997 entitled, "A Gate-Level Leakage Power Reduction Method for Ultra-Low-Power CMOS Circuits," by Jonathan P. Halter and Farid N. Najm of the ECE Dept. and Coordinated Science Lab. at the University of Illinois at Urbana-Champaign ("the Halter reference"), another approach to reducing leakage power is proposed. The Halter reference describes an approach wherein, an algorithmically determined input vector is applied to the multi-gate logic circuit during an idle period to reduce leakage power of the multi-gate logic circuit during the idle period.

The algorithm described in the Halter reference for selecting such an input vector is based on a process of random sampling. Randomly chosen vectors are applied to the circuit, the leakage due to each is monitored and the vector that gives the least observed leakage out of those selected is used.

An issue with the approach described in the Halter reference is that the only way to know whether a chosen vector provides good leakage reduction is to choose and test many other vectors. For complex circuits including hundreds or thousands of gates, this task can require significant time. Further, there is virtually no way to know whether another input vector that has not been tested might provide leakage reduction superior to the chosen vector. The chance of choosing the input vector that provides the maximum, or close to the maximum, leakage reduction possible for a given circuit using the approach described in Halter is very small, particularly for large circuits having many inputs.

SUMMARY OF THE INVENTION

A method and apparatus for reducing standby leakage current using a transistor stack effect are described.

For one embodiment, an apparatus includes a standby leakage reduction circuit to be coupled to an internal circuit block that includes a plurality of logic gates, the standby leakage reduction circuit to cause a stack effect at each of the plurality of logic gates during a standby mode of the internal circuit block.

Other features and advantages of the present invention will be apparent from the accompanying drawings and from the detailed description that follows below.

BRIEF DESCRIPTION OF THE DRAWINGS

The present invention is illustrated by way of example and not limitation in the figures of the accompanying drawings in which like references indicate similar elements, and in which.

DETAILED DESCRIPTION

A method and apparatus for reducing standby leakage current using a transistor stack effect are described. In the following description, particular types of circuits are described for purposes of illustration. It will be appreciated, however, that other embodiments are applicable to other types of circuits.

For one embodiment, a circuit includes a standby leakage reduction circuit to be coupled to a circuit block. The circuit block includes a plurality of logic gates to perform a particular function. The standby leakage reduction circuit operates to cause a stack effect at each of the plurality of logic gates during a standby mode of the circuit block. A transistor stack, as the term is used herein, refers to two or more series-coupled transistors of a same type (either n-type or p-type). Thus, for one embodiment, the standby leakage reduction circuit causes the stack effect by turning off at least two transistors of a same type coupled in series for each of the logic gates to reduce leakage current during the standby mode.

Figure 1:
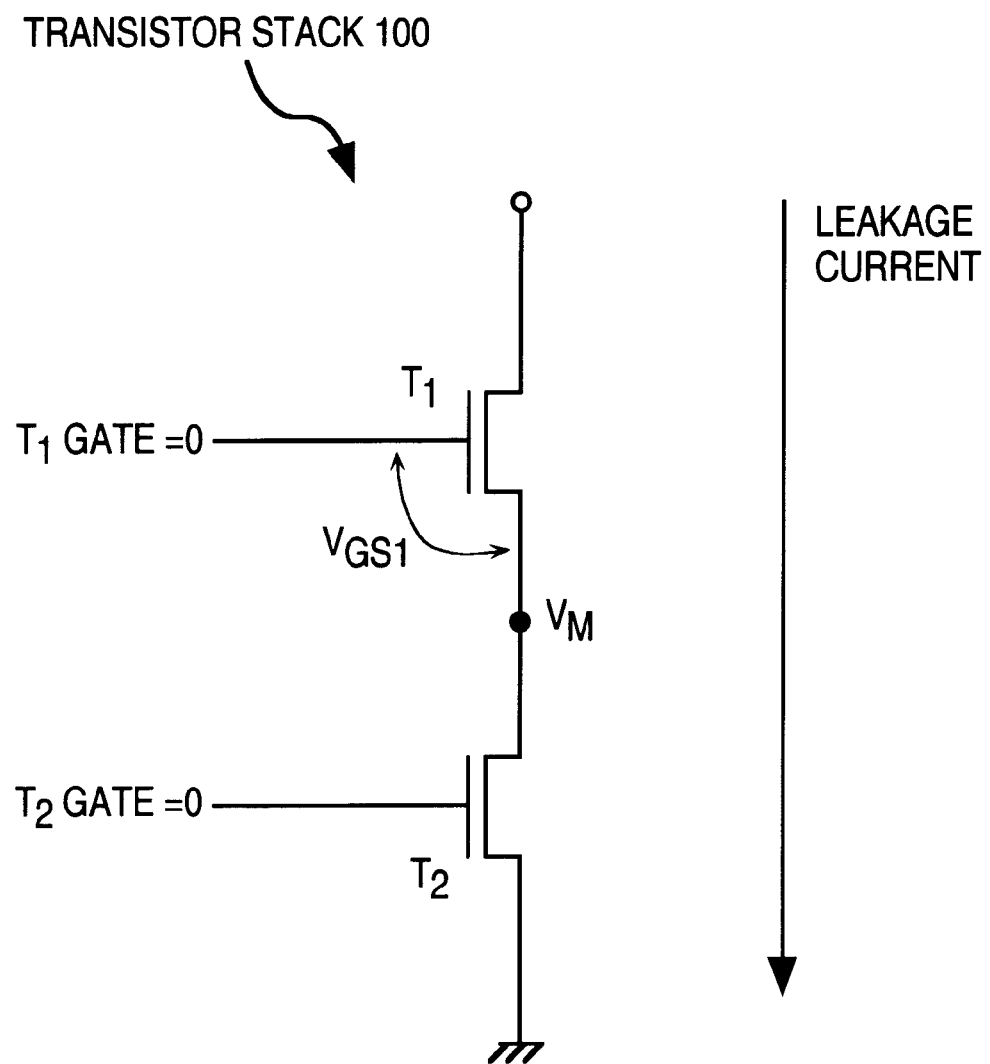
FIG. 1 is a schematic representation of a transistor stack.

To illustrate the stack effect used in various embodiments described below, FIG. 1 shows a schematic diagram of a transistor stack 100 including two series-coupled n-type devices $T_1$ and $T_2$. When both $T_1$ and $T_2$ are turned off (i.e. when the voltage at both of their gates is a logical 0), the gate to source voltage ($V_{GS1}$) of $T_1$ is less than 0. Additionally, the bodies of the transistors $T_1$ and $T_2$ are tied to ground or another voltage. When both $T_1$ and $T_2$ are turned off, the threshold voltage of $T_1$ is increased due to the body effect. Turning $T_1$ and $T_2$ off also reduces the drain to source voltage $V_{DS2}$ of $T_2$ causing the threshold voltage of $T_2$ to increase as the voltage at the intermediate node Vm converges to a very small value.

The above effects alone and/or in combination cause the leakage current through the transistor stack 100 to be approximately an order of magnitude smaller when both $T_1$ and $T_2$ are turned off as compared to when only one of $T_1$ or $T_2$ is turned off. This result is referred to herein as the stack effect. For transistor stacks including more than two transistors of a same type coupled in series, an even larger reduction in leakage current due to the stack effect is possible where three or more stacked transistors are turned off at once. The stack effect results in similar advantages for two or more series-coupled p-type transistors that are turned off at the same time.

Other than inverters, most common logic gates include stacked transistors in p-type trees, n-type trees or both. For example, NOR gates include stacked p-type transistors and NAND gates include stacked n-type transistors. Thus, circuit blocks typically contain a large percentage of logic gates in which transistor stacks are present.

Where a particular logic gate in a circuit block includes a transistor stack, however, it may be difficult, or in some cases, impossible, to turn off multiple transistors in the stack through circuit block inputs during a standby mode, for example, to take advantage of this effect. This problem is addressed by various embodiments described below.

Figure 2:
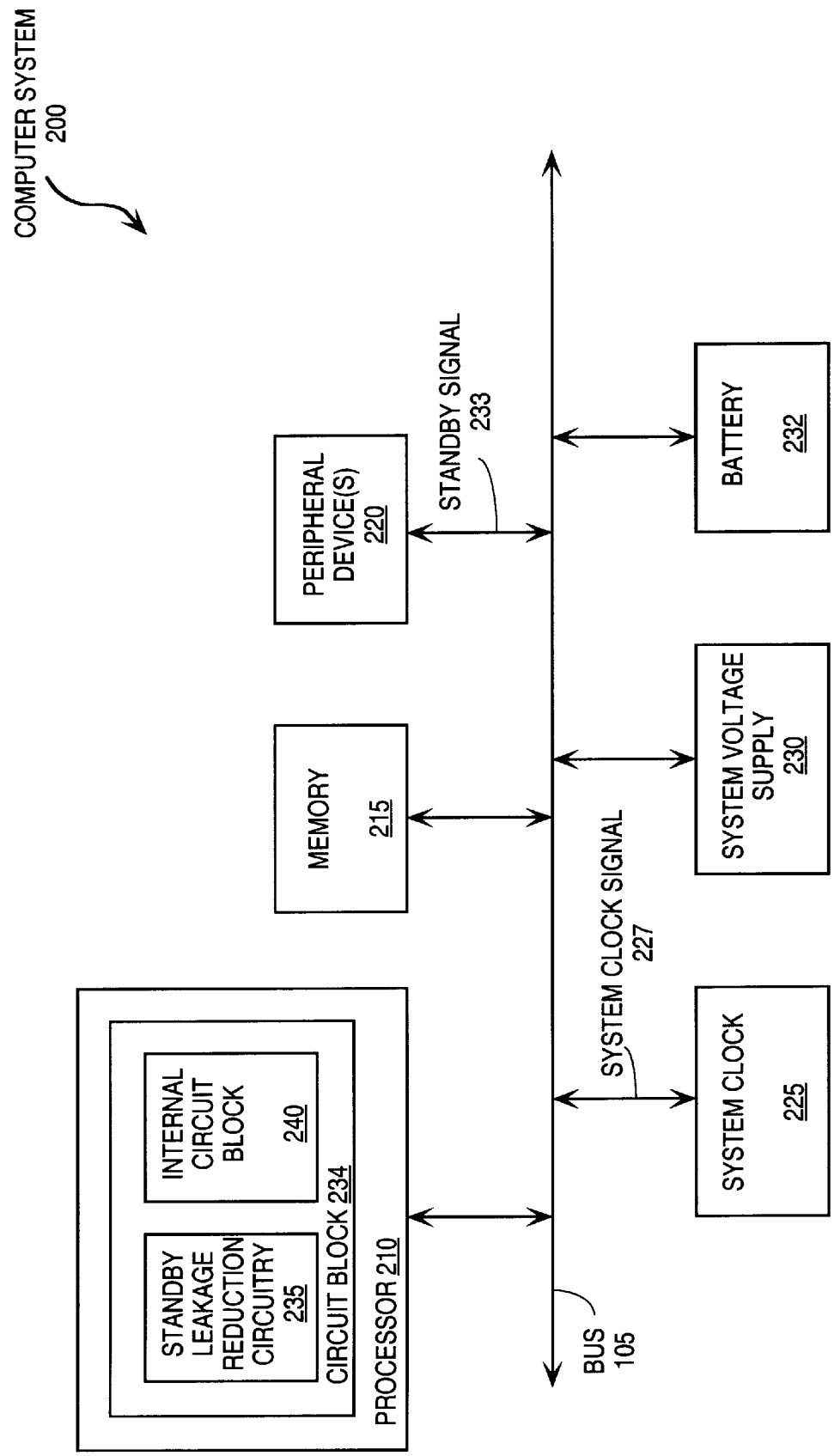
FIG. 2 is a block diagram of a computer system in which one embodiment of the standby leakage reduction circuitry may be used.

FIG. 2 is a block diagram showing an example of a mobile computer system 200 (e.g. laptop, notebook or handheld computer) in which standby leakage reduction circuitry of one embodiment may be implemented. The computer system 200 includes a bus 205 for communicating information among various components of the computer system 200. A processor 210 for processing instructions, one or more memories 215 to store instructions and information for use by the processor 210, one or more peripheral devices 220, a system clock 225, a system voltage supply 230 and a battery 232 are coupled to the bus 205 for one embodiment.

The system clock 225 provides a system clock signal 227 to one or more of the components of the computer system 200. The system voltage supply 230 provides a system operating voltage for the computer system 200. The peripheral(s) 220 may provide a system standby signal 233 to cause the system 200 to enter a lower power mode in response to particular events.

For one embodiment, the processor 210 includes a circuit block 234 including standby leakage reduction circuitry 235 to reduce leakage current of an internal circuit block 240 during a standby mode. A circuit block, as the term is used herein, refers to interconnected circuitry having a set of inputs and a set of outputs wherein the circuit block is provided to perform one or more particular functions. A circuit block may be in the form of a functional unit block (FUB), for example, and typically includes many transistors forming various logic gates. The internal circuit block in the embodiments described below includes the logic gates of the circuit block, except for the standby leakage reduction circuitry, that perform the intended function of the circuit block.

It will be appreciated that, for other embodiments, the standby leakage reduction circuitry and a corresponding circuit block may be provided on other types of integrated circuit devices including, for example, chipsets and other peripheral chips.

It will also be appreciated that systems other than mobile computer systems, or computer systems configured in another manner than the computer system 200 of FIG. 2, may also be used with various embodiments.

Figure 3:
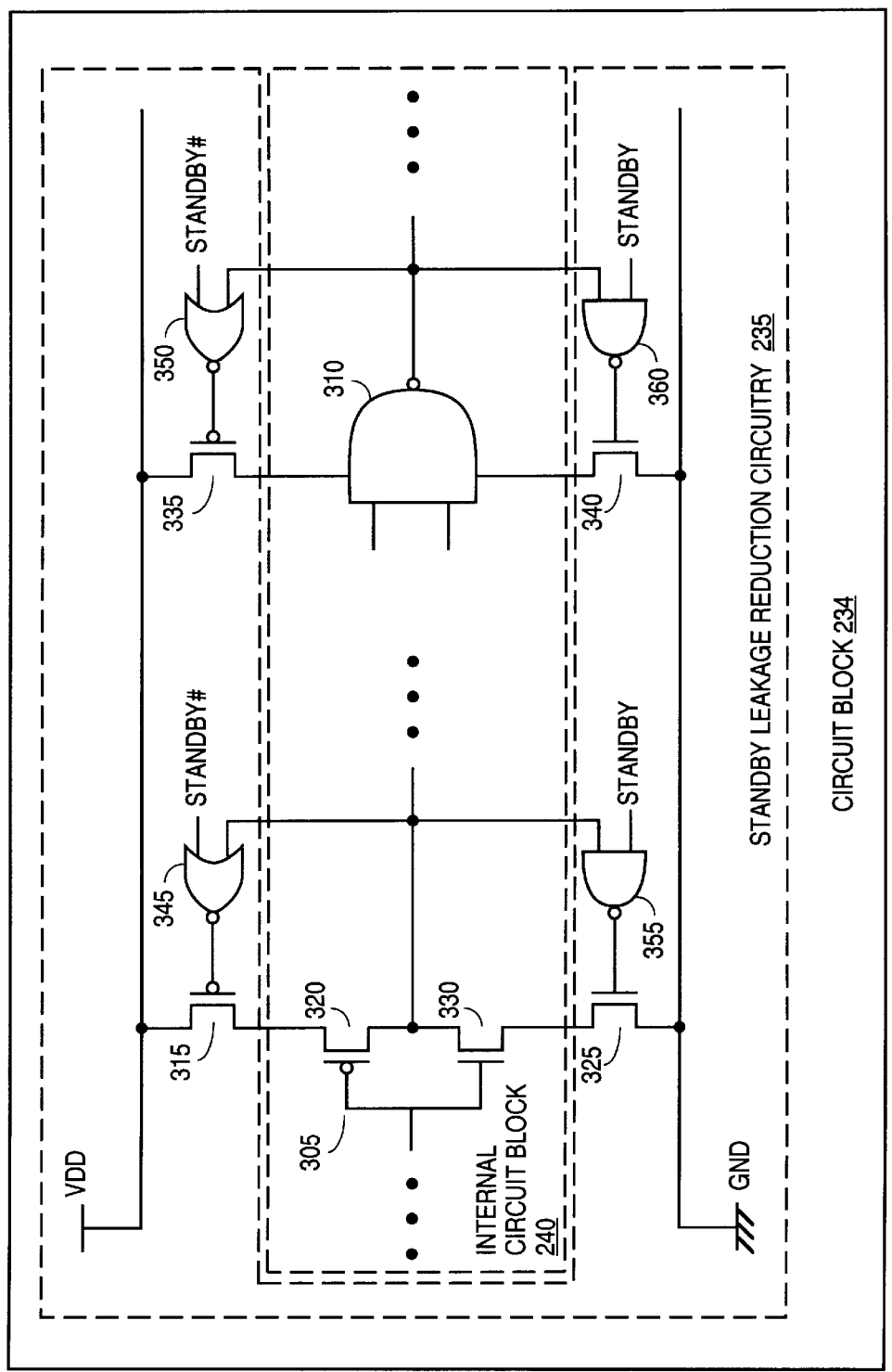
FIG. 3 is diagram showing one embodiment of the circuit block and standby current reduction circuitry of FIG. 2 in more detail.

FIG. 3 is a block diagram showing one embodiment of the internal circuit block 240 and standby leakage reduction circuitry 235 in more detail. As shown in FIG. 3, the internal circuit block 240 includes logic gates 305 and 310. For purposes of illustration, an inverter 305 and a logical NAND gate 310 are shown. It will be appreciated that the internal circuit block 240 may include other types of logic gates and/or additional logic gates not shown. For example, the internal circuit block 240 may be a FUB such as an adder that includes several hundred logic gates.

For one embodiment, the internal circuit block 240 is designed and fabricated using complementary logic such as complementary metal oxide semiconductor (CMOS) logic. In this manner, the internal circuit block 240 includes both n-type and p-type transistors. Further, various embodiments are applicable to static and/or dynamic logic gates that include both n-type and p-type transistor(s).

The standby leakage reduction circuitry 235 of the embodiment shown in FIG. 3 includes an extra p-type transistor, referred to herein as a p-type leakage control device, in the pull-up path. The standby leakage reduction circuitry 235 of FIG. 3 also includes an extra n-type transistor, referred to herein as an n-type leakage control device, in the pull-down path for each of the logic gates in the internal circuit block 140. For example, for the inverter 305, a p-type leakage control device 315 is coupled in series with the p-type device 320 of the inverter 305 and an n-type leakage control device 325 is coupled in series with the n-type device 330 of the inverter 305. Similarly, a p-type leakage control device 335 is coupled in series with the NAND gate 310 in its pull-up path while an n-type leakage control device 340 is coupled in series with the NAND gate 310 in its pull-down path.

The p-type leakage control devices, including the p-type devices 315 and 335, are controlled by additional NOR gates including the NOR gates 345 and 350, respectively. The n-type leakage control devices, including the n-type devices 325 and 340 are controlled by additional NAND gates including the NAND gates 355 and 360, respectively. The additional NOR gates and NAND gates are referred to herein as leakage control NOR gates and leakage control NAND gates, respectively, to distinguish them from NOR and/or NAND gates that may be included within the internal circuit block 140.

As shown in FIG. 3, the leakage control NOR gates 345 and 350 each have one input coupled to an output of the corresponding logic gate and another input coupled to receive a complement of a STANDBY signal. An output of each of the leakage control NOR gates 345 and 350 is coupled to a gate of the corresponding p-type leakage control device 315 or 335, respectively. Also as shown in FIG. 3, the leakage control NAND gates 325 and 340 each have one input coupled to an output of the corresponding logic gate and another input coupled to receive the STANDBY signal. An output of each of the leakage control NAND gates 355 and 360 is coupled to a gate of the corresponding n-type leakage control device 325 or 340, respectively.

The STANDBY signal may be a system standby signal such as the system standby signal 233 (FIG. 2), a local standby signal or any type of signal that puts the internal circuit block 240 into a lower power state.

For one embodiment, the STANDBY signal is a clock gating signal used to selectively prevent specific circuitry in the circuit block 234 from being clocked. In this manner, the STANDBY signal is used to reduce power dissipation of the circuit block 234 and/or other circuitry at particular times. For one embodiment, when the STANDBY signal is not asserted (i.e. the STANDBY# signal is asserted), the circuit block 234 is in an active mode.

For an alternative embodiment, an ACTIVE signal or any type of signal that puts the circuit block 234 and/or the internal circuit block 240 into an active mode may be used in place of a STANDBY signal such that a low power mode is entered when the ACTIVE signal is deasserted. Whatever signal is used, it is desirable during such a lower power mode to have the power dissipation of the internal circuit block 240 as low as possible.

In operation, when the STANDBY signal is asserted, for each gate in the internal circuit block 240, either the corresponding p-type leakage control transistor or the corresponding n-type leakage control transistor is turned off depending on the output of the gate. For example, if the output of the gate 305 is high when the STANDBY signal is asserted, the output of the corresponding NAND gate 355 is low causing the n-type leakage control transistor 325 in the pull-down path to be turned off. Because the output of the inverter 305 is high, the n-type gate 330 is also turned off.

Alternatively, if the output of the inverter 305 is low when the STANDBY signal is asserted, the output of the NOR gate 345 will be high causing the p-type leakage control transistor in the pull-up path to be turned off. Because the output of the inverter 305 is low, the p-type gate 320 is also turned off.

Thus, even though the inverter 305 on its own does not include any transistor stacks, the standby leakage reduction circuitry 235 causes the stack effect at the inverter 305 by ensuring that two transistors of a same type coupled in series are turned off during a standby mode. In this manner, the standby leakage reduction circuitry 235 uses the stack effect to reduce standby leakage current of the inverter 305 during a standby mode.

All other logic gates in the internal circuit block 240, such as the NAND gate 310, also include at least one p-type transistor in the pull-up path and at least one n-type transistor in the pull-down path. This is because each of the logic gates in the internal circuit block 240 for this embodiment is designed and fabricated using complementary logic such as CMOS. Thus, the standby leakage reduction circuitry 235 causes the stack effect at each logic gate in the internal circuit block 240 during a standby mode in a manner similar to that described above for the inverter 305. Because each of the logic gates in the internal circuit block 240 has reduced leakage current due to the stack effect, the cumulative leakage current reduction for the internal circuit block can be significant.

It will be appreciated that the standby leakage reduction circuitry of other embodiments may be configured in a different manner to provide similar functionality. It will also be appreciated that the standby leakage reduction circuitry of the embodiments described above may be used with one or more discrete logic gates to reduce their leakage in response to a control signal such as a standby signal.

Figure 4:
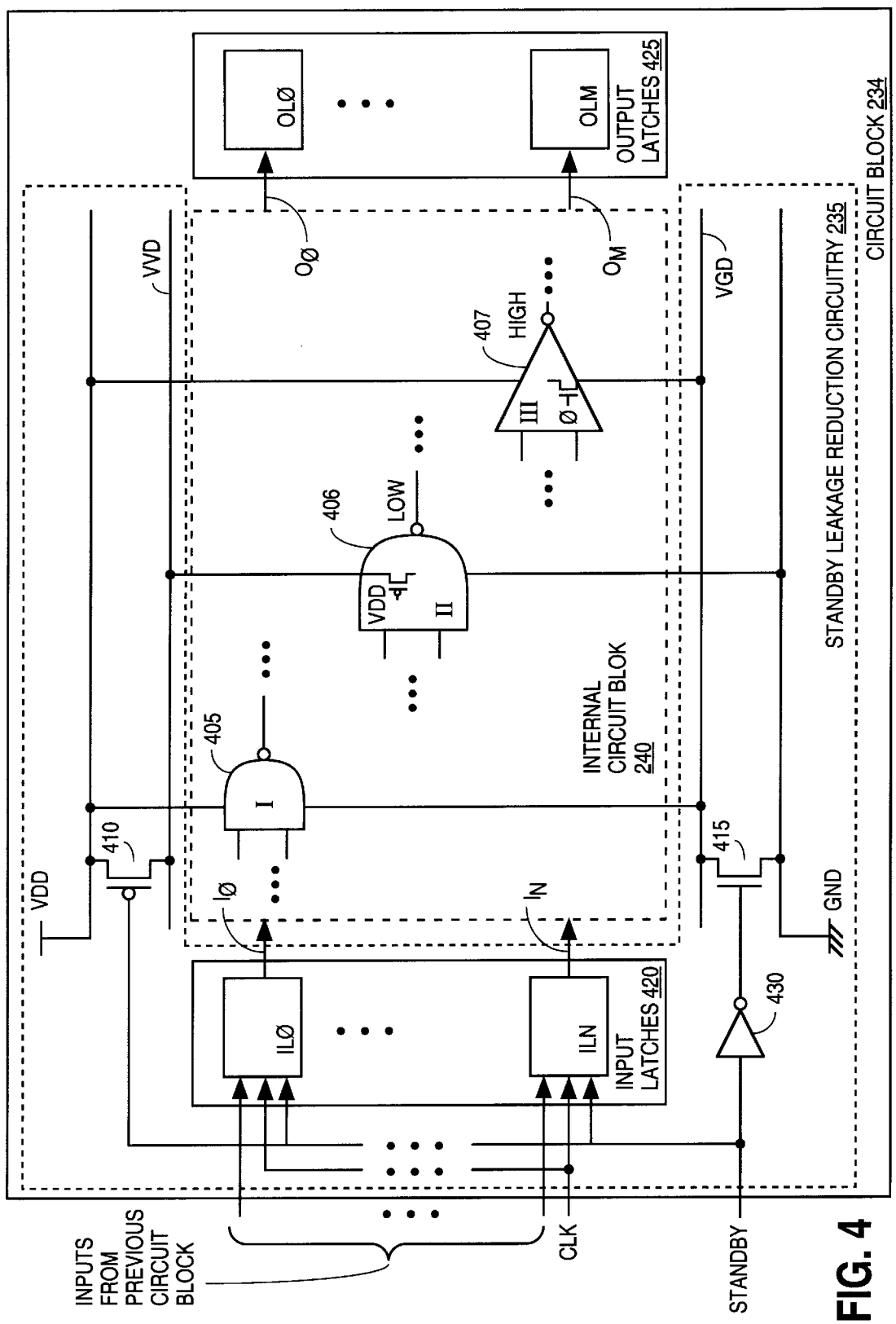
FIG. 4 is a block diagram showing another embodiment of the circuit block and standby leakage reduction circuitry of FIG. 2 in more detail.

FIG. 4 is a block diagram of another embodiment of the standby leakage reduction circuitry 235 and internal circuit block 240. The internal circuit block 240 of FIG. 4, like the internal circuit block 240 of FIG. 3 includes multiple logic gates and may be a FUB such as an adder or other datapath circuit, for example. For other embodiments, the internal circuit block 240 may be a different type of circuit.

For one embodiment, the internal circuit block 240 of FIG. 4 is also designed and fabricated using complementary logic, such as CMOS, that includes both n-type and p-type devices. Thus, for each logic gate in the internal circuit block 240, an n-type device is included in the pull-down path and a p-type device is included in the pull-up path.

For purposes of illustration, the exemplary logic gates 405–407 shown in FIG. 4 as being included within the internal circuit block 240 include NAND gates 405 and 406 and an inverter 407. It will be appreciated, however, that the internal circuit block 240 may include many other types of gates in addition to and/or in place of the specific gates 405–407 shown in FIG. 4.

The standby leakage reduction circuitry 235 of the embodiment shown in FIG. 4 includes a p-type leakage control transistor 410, an n-type leakage control transistor 415 and input latches 420.

The input latches 420 include input latches $IL_0$–$IL_N$, where N may be any positive integer. The input latches $IL_0$–$IL_N$ apply logical values in the form of an input vector to corresponding inputs $I_0$–$I_N$ of the internal circuit block 240. The input vector applied by the input latches $IL_0$–$IL_N$ may be incoming data directed to the internal circuit block 240 from a previous circuit block (not shown). In this case, the input latches $IL_0$–$IL_N$ provide the latched data, or an inverse of the latched data, to the corresponding inputs of the internal circuit block 240.

Each of the input latches $IL_0$–$IL_N$ are also coupled to receive a clock signal CLK. The CLK signal is used to synchronize the latches $IL_0$–$IL_N$ in a well-known manner such that an input vector latched by the latches $IL_0$–$IL_N$ is applied concurrently to the corresponding inputs $I_0$–$I_N$. The CLK signal may be the system clock signal 227 from the system clock 225 (FIG. 2), or an internal or local clock signal, for example. For one embodiment, in addition to receiving the CLK signal and data from preceding logic, the input latches $IL_0$–$IL_N$ are coupled to receive the STANDBY signal.

As discussed above, taking advantage of the stack effect, leakage current in a circuit can be reduced by turning off more than one transistor in a transistor stack. The leakage current of the internal circuit block 240 can, therefore, be reduced during a standby mode, or at other times the circuit block 240 is idle, by selecting an input vector that causes multiple transistors in stacks in the internal circuit block 240 to be turned off. The selected input vector is applied at the inputs $I_0$–$I_N$ at the times when it is desirable to reduce the circuit block 234 leakage current. An input vector, as the term is used herein, refers to a string of logical 1s and/or 0s corresponding to a set of circuit block inputs, wherein the string of 1s and/or 0s is applied in parallel to the corresponding inputs.

In accordance with one embodiment, by evaluating the configuration of a circuit block to identify the transistor stacks, selection of an appropriate input vector is greatly simplified. This approach is described in more detail in the copending patent application Ser. No. 09/150,869 entitled A Method and Apparatus for Reducing Standby Leakage Current Using Input Vector Activation, filed Sep. 10, 1998, (Attorney Docket No. 42390.P5837) and assigned to the assignee of the present application.

For example, in order to select an input vector to be applied to the internal circuit block 240 during a standby mode, the internal circuit block 240 is analyzed to identify transistor stacks. An input vector to be applied at the inputs $I_0$–$I_N$ is then selected based on the circuit block configuration to turn off as many transistors in stacks as possible.

Examination of the internal circuit block 240 structure to identify a desirable input vector may be performed visually using internal circuit block 240 schematics. Alternatively, the internal circuit block 240 structure may be examined to identify transistor stacks and a desirable input vector using a computer system, specialized software stored on a data storage media and executed by a computer system, or another type of tool.

Where analysis of a circuit block in the above manner produces a range of possible input vectors, the range of possible input vectors can be tested and the input vector that provides the greatest leakage reduction may be used. This approach may be used, for example, for less regular circuit blocks.

For another embodiment, vectors may be randomly chosen and tested to determine which of the chosen vectors provides the best leakage reduction as described in the Halter reference referred to in the Background.

Other approaches, including other approaches that take into consideration the identification of transistor stacks in a circuit block to identify an input vector to be applied during a standby mode to reduce leakage current, are also within the scope of various embodiments.

With continuing reference to FIG. 4, once a desirable input vector is identified, the standby leakage reduction circuitry is appropriately configured to provide the desired input vector at the desired times. For one embodiment, the input latches $IL_0$–$IL_N$ are configured to "store" the identified input vector and to provide the input vector to the corresponding inputs $I_0$–$I_N$ when the STANDBY signal is asserted. Static latches such as those shown in FIGS. 5 and 6 are used to apply the selected input vector for one embodiment.

Figure 5:
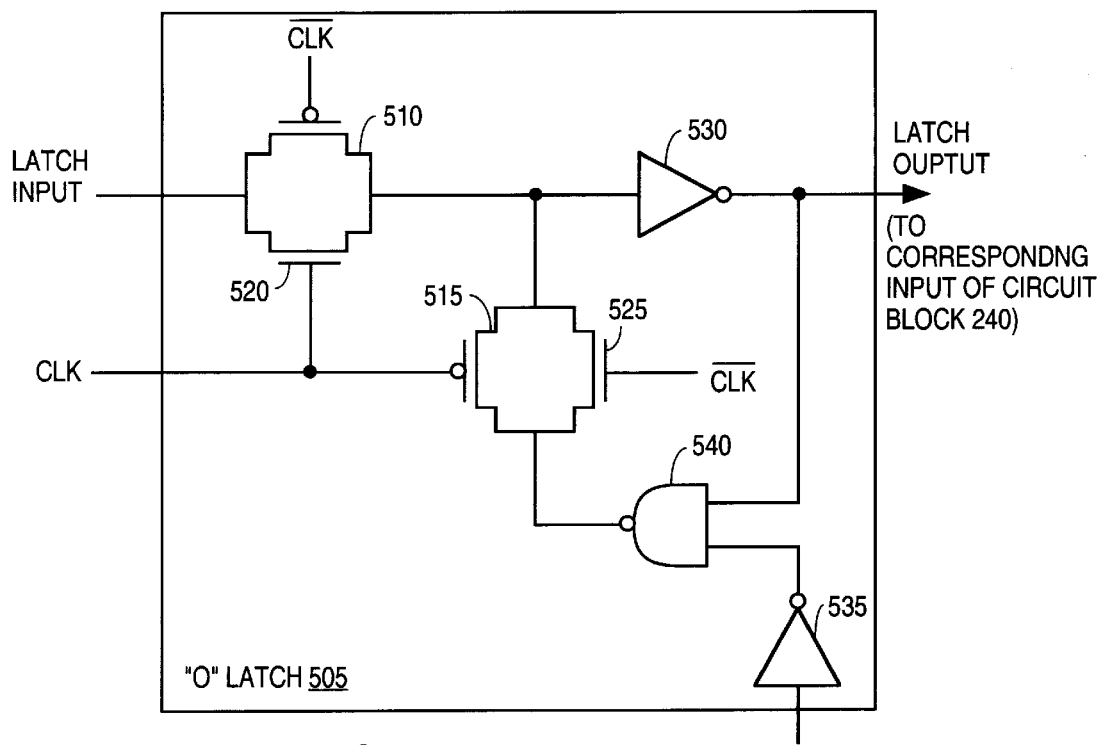
FIG. 5 is a schematic representation of one embodiment of a latch that may be used to provide a logical "0" at an input of the circuit block of FIG. 5 during a standby mode.
Figure 6:
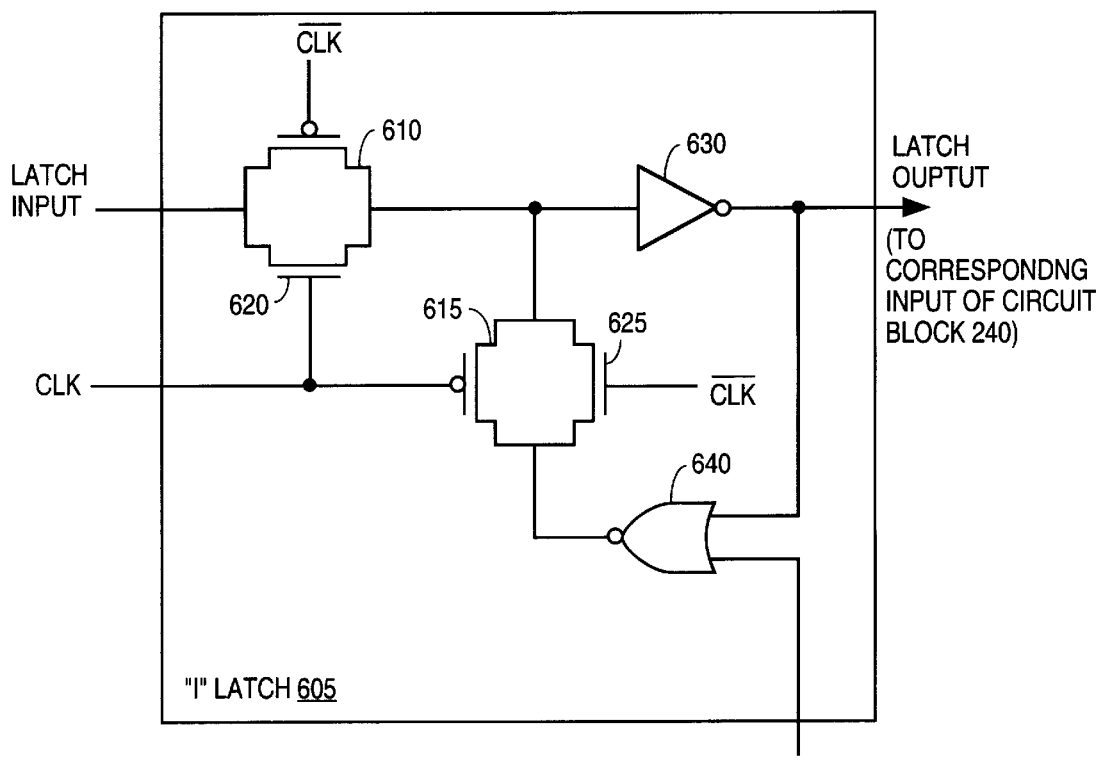
FIG. 6 is a schematic representation of one embodiment of a latch that may be used to provide a logical "1" at an input of the circuit block of FIG. 5 during a standby mode.

FIG. 5 shows one embodiment of a "0" latch 505 that may be used to store and apply a logical 0 to a corresponding input. The "0" latch 505 includes p-type transistors 510 and 515, n-type transistors 520 and 525, inverters 530 and 535 and a NAND gate 540, all of which are coupled in the manner shown in FIG. 5.

In operation, when the STANDBY signal is not asserted, a logical value at the latch 505 input from preceding logic is passed through to an input of the inverter 530, inverted and provided at the latch 505 output.

When the STANDBY signal is asserted, however, the output of the NAND gate 540 is a logical 1 which is provided at the input of the inverter 530 to force a logical 0 at the latch 505 output regardless of the value at the latch 505 input.

Similarly, the "1" latch 605 of FIG. 6 includes p-type transistors 610 and 615, n-type transistors 620 and 625, an inverter 630 and a NOR gate 640 coupled in the manner shown in FIG. 6. When the STANDBY signal is not asserted, the logical value at the latch 605 input is received at the inverter 630 input, inverted and provided at the latch 605 output.

When the STANDBY signal is asserted, the output of the NOR gate 640 transitions to a logical 0 value which is provided at the inverter 630 input. Accordingly, a logical 1 is forced at the latch 605 output when the STANDBY signal is asserted regardless of the logical value at the latch 605 input.

Thus, the input latches $IL_0$–$IL_N$ of this embodiment each operate in the manner described with reference to FIGS. 5 or 6 to provide the desired input vector when the STANDBY signal is asserted.

For some embodiments, output latches 425, including output latches $OL_0$–$OL_M$ (where M may be any integer) corresponding to internal circuit block 240 outputs $O_0$–$O_M$, respectively, may also be provided. Output latches 425 latch data available at the corresponding outputs $O_0$–$O_m$ of the internal circuit block 240 for use by succeeding logic (not shown) and may function as input latches for another circuit block (not shown).

It will be appreciated that, for other embodiments, the "0" and "1" latches described above may be configured in a different manner than that shown in FIGS. 5 and 6, respectively. Further, for other embodiments, a selected input vector for a particular circuit block may be stored in a memory and applied during a standby or low power mode through input latches to the particular circuit block. Also, for still other embodiments, a selected input vector may be applied to a particular circuit block through software, registers or in another manner.

With continuing reference to FIG. 4, in addition to the input latches 420, the standby leakage reduction circuitry of the embodiment shown in FIG. 4 includes the p- and n-type leakage control transistors 410 and 415, respectively. The p-type leakage control transistor 410 has a first terminal coupled to a virtual supply line VVD in series with the internal circuit block 240, a second terminal coupled to receive a supply voltage VDD and a gate coupled to receive a STANDBY signal. The supply voltage VDD may be provided by the system voltage supply 230 (FIG. 2), or VDD may be a separate supply voltage used for circuitry internal to the processor 210 (FIG. 2) or another circuit on which the circuit block 234 is provided.

The n-type leakage control transistor 415 has a first terminal, a source terminal in this example, coupled to a virtual ground line VGD in series with the internal circuit block 240, a second terminal coupled to receive a ground supply voltage GND and a gate coupled to receive an inverse of the STANDBY signal through an inverter 430.

Depending on the circuit block configuration and given number of inputs, it may not be possible to turn off all transistors in stacks with any input vector. In particular, some logic gates that include a transistor stack may not have two or more stacked transistors turned off in response to application of the selected input vector. Further, there may be one or more logic gates in the internal circuit block 240, such as the inverter 407, that does not include a transistor stack. It will be appreciated that, using only the above approach, such gates do not take advantage of the transistor stack effect to further reduce leakage during a standby mode.

For one embodiment, to further reduce standby leakage current once a desirable input vector is identified, the internal circuit block 240 is further analyzed to identify gates that do not have two or more transistors in stacks turned off in response to application of the selected input vector. For each such gate, it is then determined whether the output of the gate is high or low in response to application of the selected input vector during the standby mode. These steps are typically performed during circuit design.

Following this approach, each of the gates in the internal circuit block 240 is classified into one of three categories: I.) gate(s) that benefit from the stack effect (i.e. have more than one transistor in a transistor stack turned off) in response to the standby input vector, II.) gate(s) that do not benefit from the stack effect in response to application of the standby input vector and that have a logical low output in response to application of the input vector at the internal circuit block inputs $I_0-I_N$, and III.) gate(s) that do not benefit from the stack effect in response to the standby input vector and that have a logical high output in response to application of the input vector at the internal circuit block inputs $I_0-I_N$.

Some gates that fall into the second and/or third categories above may include stacked transistors, but more than one transistor in the stack may not be turned off. Other gates in the second and third categories above may not include a transistor stack.

Once each of the gates in the internal circuit block 240 has been categorized in accordance with the above approach, an appropriate connection for each of the gates to the supply and/or virtual supply lines is determined. For one embodiment, each category I gate, such as the gate 405, is designed to be coupled between the VDD and GND supply lines. Each category II gate, such as the gate 406, has one terminal coupled to the VVD virtual supply line and another terminal coupled to the GND supply line. Each category III gate, such as the gate 407, has one terminal coupled to the VDD supply line and one terminal coupled to the VGD virtual supply line.

In operation, when the STANDBY signal is asserted, the predetermined input vector is applied at the internal circuit block 240 inputs $I_0-I_N$ as described above. In response to the predetermined input vector being applied at the inputs $I_0-I_N$, two or more transistors coupled in series are turned off for each of the category I gates in the internal circuit block 240, such as the gate 405, such that the stack effect is realized at each such gate.

Assertion of the STANDBY signal further turns off the p- and n-type leakage control transistors 410 and 415, respectively. Turning off the p- and n-type leakage control transistors 410 and 415 enables category II and category III gates in the internal circuit block 240 to also take advantage of the stack effect to reduce standby leakage current.

For example, the output of the category II gate 406 is low in response to the application of the predetermined input vector at the inputs $I_0-I_N$. Because the output of the gate 406 is low, a p-type transistor in the gate 406 pull-up path is turned off. The p-type leakage control transistor 410 is coupled in series with the gate 406 such that the p-type pull-up transistor of the gate 406 is coupled in series with the p-type leakage control transistor 410. Because both the p-type leakage control transistor 410 and the p-type pull-up transistor of the gate 406 are off, the stack effect is realized at the gate 406, and for all other category II gates, during a standby mode of the internal circuit block 240.

The stack effect is taken advantage of in a similar manner to also reduce standby current leakage of category III gates. Because the output of category III gates is high in response to application of the predetermined standby input vector, an n-type transistor in the pull-down path of the gate 407 is turned off. Further, the n-type leakage control transistor 415, which has been turned off in response to assertion of the STANDBY signal, is coupled in series with the gate 407, and specifically, the n-type pull-down transistor of the gate 407. In this manner, the stack effect is realized for each category III gate in the internal circuit block 240.

Using the above approach, for each gate in the internal circuit block 240, two or more transistors of a same type coupled in series are turned off during a standby mode. Standby leakage current can thus be significantly reduced as compared to a similar internal circuit block that does not use the above described standby input vector and/or categorization and design approaches.

For one embodiment, the size of the leakage control transistors 410 and 415 may be larger than the transistors of the internal circuit block 240 to keep the resistance low between the supply voltage lines and the virtual supply lines. The size of the leakage control transistors 410 and 415 is balanced, however, by the fact that not all gates in the internal circuit block 240 are coupled to the leakage control transistors. Specifically, only category II gates are coupled in series with the p-type leakage control transistor 410 and only category III gates are coupled in series with the n-type leakage control transistor 415.

Figure 7:
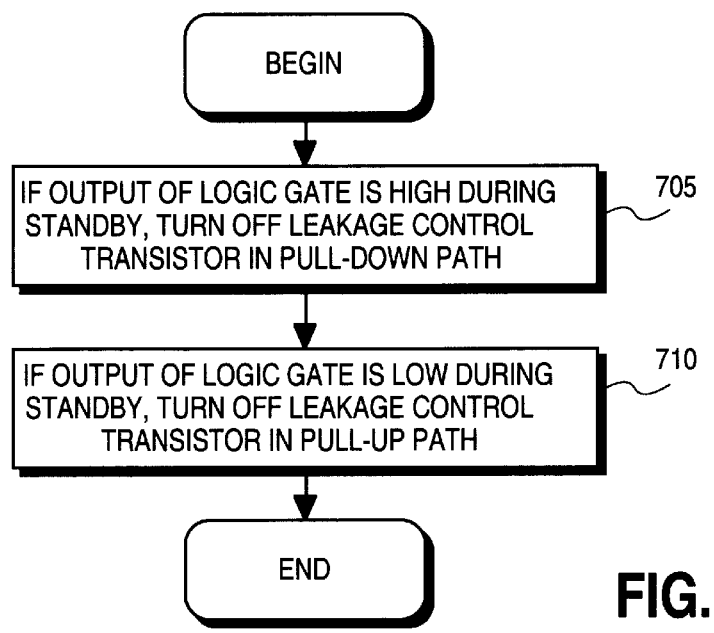
FIG. 7 is a flow diagram showing one embodiment of a method for reducing standby leakage current.

FIG. 7 is a flow diagram showing one embodiment of a method for reducing standby leakage current. In step 705, if the output of a logic gate is high during a standby mode, a leakage control transistor in the pull-down path of the logic gate is turned off. In step 710, if the output of a logic gate is low during a standby mode, a leakage control transistor in the pull-up path of the logic gate is turned off.

Figure 8:
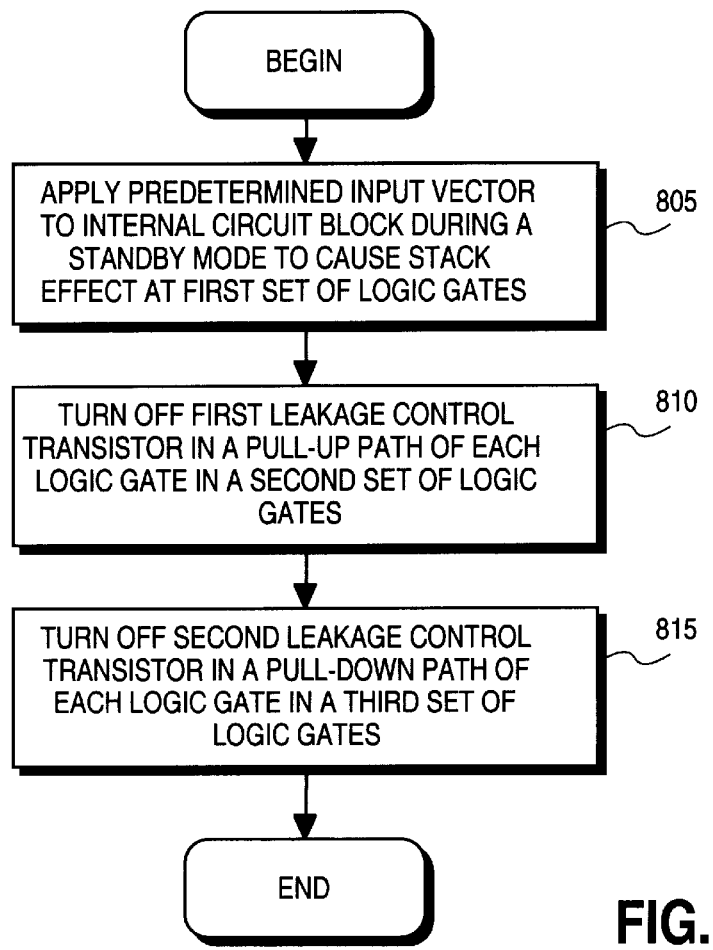
FIG. 8 is a flow diagram showing another embodiment of a method for reducing standby leakage current.

For another embodiment, as shown in FIG. 8, a method for reducing standby leakage current includes a step 805 of applying a predetermined input vector to inputs of an internal circuit block during a standby mode to cause a stack effect at a first set of logic gates in the internal circuit block.

In step 810, a first leakage control transistor in a pull-up path of each logic gate in a second, different set of logic gates is turned off. This step is performed to cause the stack effect at the second set of logic gates also.

In step 815, a second leakage control transistor in a pull-down path of each logic gate in a third, different set of logic gates is turned off. This step is performed to also cause the stack effect at the third set of logic gates.

In accordance with each of the above methods, the stack effect is achieved at each logic gate in an internal circuit block to reduce leakage current during a standby mode.

It will be appreciated that the methods described with reference to FIGS. 7 and 8 may not include all of the steps described or may include additional steps not shown in FIG. 7 or FIG. 8.

The standby leakage reduction method and apparatus of various embodiments reduces leakage current in circuits and/or circuit blocks in the manner described above without necessitating process changes. There is also minimal impact to the manner in which circuit blocks are designed other than, for some embodiments, 1) determining at design time what the desired input vector for a given circuit block will be, 2) integrating the appropriate latch or means for providing the selected vector during a standby mode, 3) categorizing the gates and 4) providing the appropriate supply connections. Using the above-described approaches, it may be possible to alleviate the need to design devices with higher threshold voltages to provide leakage reduction in current and future low process technologies.

In the foregoing specification, the invention has been described with reference to specific exemplary embodiments thereof. It will, however be appreciated that various modifications and changes may be made thereto without departing from the broader spirit and scope of the invention as set forth in the appended claims. The specification and drawings are, accordingly, to be regarded in an illustrative rather than a restrictive sense.

What is claimed is:

1. An apparatus comprising:
a standby leakage reduction circuit to be coupled to an internal circuit block that includes a plurality of logic gates, the standby leakage reduction circuit being responsive to an output state of each logic gate in the internal circuit block to cause a stack effect at each of the plurality of logic gates during a standby mode of the internal circuit block.

2. The apparatus of claim 1 wherein the standby leakage reduction circuit includes
a p-type leakage control transistor to be coupled with each logic gate and to a first supply voltage, the p-type leakage control transistor to be turned off if the corresponding logic gate has a logical low output during the standby mode, and
an n-type leakage control transistor to be coupled with each logic gate and to a second supply voltage, the n-type leakage control transistor to be turned off if the corresponding logic gate has a logical high output during the standby mode.

3. The apparatus of claim 2 wherein the first supply voltage is a power supply voltage (VDD) of the circuit block and the second supply voltage is a ground supply voltage.

4. The apparatus of claim 2 wherein the standby leakage control circuit further includes
a first type of logic gate to control each p-type leakage control transistor, each of the first type of logic gates having one input coupled to receive the output of the corresponding logic gate in the internal circuit block and another input coupled to receive a complement of a standby signal, the standby signal to indicate initiation of the standby mode, and
a second type of logic gate to control each n-type leakage control transistor, each of the second type of logic gates having one input coupled to receive the output of the corresponding logic gate in the internal circuit block and another input coupled to receive the standby signal.

5. The apparatus of claim 4 wherein the first type of logic gate is a NOR gate, and the second type of logic gate is a NAND gate.

6. An apparatus comprising:
a standby leakage reduction circuit to be coupled to an internal circuit block that includes a plurality of logic gates, the standby leakage reduction circuit to cause a stack effect at each of the plurality of logic gates during a standby mode of the internal circuit block, wherein the standby leakage reduction circuitry includes a plurality of latches, the plurality of latches including a latch corresponding to each of a plurality of inputs to the internal circuit block, the plurality of latches to apply a selected input vector to the plurality of inputs during the standby mode, application of the selected input vector to cause a stack effect in a first set of the plurality of logic gates.

7. The apparatus of claim 6 wherein each of the logic gates in the first set of the plurality of logic gates has one terminal coupled to a power supply voltage and one terminal coupled to a ground supply voltage.

8. The apparatus of claim 6 wherein,
for a second, different set of the plurality of logic gates, application of the selected input vector causes each logic gate in the second set to have a logical low output,
the standby leakage reduction circuitry further including a p-type leakage control transistor having one terminal coupled to a supply voltage and another terminal coupled to each of the logic gates in the second set, the p-type leakage control transistor to be turned off during the standby mode.

9. The apparatus of claim 6 wherein,
for a second, different set of the plurality of logic gates, application of the selected input vector causes each logic gate in the second set to have a logical high output,
the standby leakage reduction circuitry further including an n-type leakage control transistor having one terminal coupled to a supply voltage and another terminal coupled to each of the logic gates in the second set, the n-type leakage control transistor to be turned off during the standby mode.

10. The apparatus of claim 8 wherein,
for a third, different set of the plurality of logic gates, application of the selected input vector causes each logic gate in the third set to have a logical high output,
the standby leakage reduction circuitry further including an n-type leakage control transistor having one terminal coupled to a supply voltage and another terminal coupled to each of the logic gates in the third set, the n-type leakage control transistor to be turned off during the standby mode.

11. A method for reducing leakage current in an internal circuit block during a standby mode, the method comprising:
causing a stack effect at each logic gate in the internal circuit block during a standby mode of the circuit block responsive to an output of each logic gate.

12. The method of claim 11 wherein causing the stack effect includes:
for each logic gate,
if the output of the logic gate is high during the standby mode, turning off a first leakage control transistor in a pull-down path of the logic gate, and
if the output of the logic gate is low during the standby mode, turning off a second leakage control transistor in a pull-up path of the logic gate.

13. A method for reducing standby leakage current in an internal circuit block, the method comprising:
coupling standby leakage current reduction circuitry to the internal circuit block to cause a transistor stack effect at each logic gate in the internal circuit block responsive to an output of each logic gate.

14. The method of claim 13 wherein coupling includes:

coupling a p-type leakage control transistor in the pull-up path of each logic gate in the internal circuit block, coupling an n-type leakage control transistor in the pull-down path of each logic gate in the internal circuit block, coupling each of the p-type leakage control transistors to be turned off if the output of the corresponding logic gate is a logical low value, and coupling each of the n-type leakage control transistors to be turned off if the output of the corresponding logic gate is a logical high value.

15. A method for reducing standby leakage current in an internal circuit block, the method comprising:

coupling standby leakage current reduction circuitry to the internal circuit block to cause a transistor stack effect at each logic gate in the internal circuit block; and selecting an input vector to be applied to inputs of the internal circuit block during the standby mode, wherein coupling includes:
identifying each logic gate in the internal circuit block as (a) a gate at which a stack effect is realized in response to application of the selected input vector, (b) a gate at which the stack effect is not realized and which has a logical low output in response to application of the selected input vector or (c) a gate at which the stack effect is not realized and which has a logical high output in response to application of the selected input vector, coupling each of the gates meeting criteria (a) to power and ground, coupling each of the gates meeting criteria (b) to ground and in series with a p-type leakage control transistor, and coupling each of the gates meeting criteria (c) to power and in series with an n-type leakage control transistor.

16. A mobile computer system comprising:

a bus to communicate information;

a battery coupled to the bus;

an integrated circuit coupled to the bus to provide a standby signal to indicate a standby mode; and a processor coupled to the bus, the processor including a circuit block, the circuit block including
an internal circuit block including a plurality of logic gates, and
a standby leakage reduction circuit coupled to the internal circuit block, the standby leakage reduction circuit to cause a stack effect at each of the plurality of logic gates during the standby mode of the internal circuit block responsive to an output of each of the plurality of logic gates.

17. The mobile computer system of claim 16 wherein the standby leakage reduction circuit includes a p-type leakage control transistor coupled in series between each logic and a first supply voltage, the p-type leakage control transistor to be turned off if the corresponding logic gate has a logical low output during the standby mode, and an n-type leakage control transistor coupled in series between each logic gate and a second supply voltage, the n-type leakage control transistor to be turned off if the corresponding logic gate has a logical high output during the standby mode.

18. The mobile computer system of claim 17 wherein the standby leakage control circuit further includes a first type of logic gate to control each p-type leakage control transistor, each of the first type of logic gates having one input coupled to receive the output of the corresponding logic gate in the internal circuit block and another input coupled to receive a complement of a standby signal, the standby signal to indicate initiation of the standby mode, and a second type of logic gate to control each n-type leakage control transistor, each of the second type of logic gates having one input coupled to receive the output of the corresponding logic gate in the internal circuit block and another input coupled to receive the standby signal.

19. The mobile computer system of claim 18 wherein the first type of logic gate is a NOR gate, and the second type of logic gate is a NAND gate.

20. A mobile computer system comprising:

a bus to communicate information;

a battery coupled to the bus;

an integrated circuit coupled to the bus to provide a standby signal to indicate a standby mode; and a processor coupled to the bus, the processor including a circuit block, the circuit block including
an internal circuit block including a plurality of logic gates, and
a standby leakage reduction circuit coupled to the internal circuit block, the standby leakage reduction circuit to cause a stack effect at each of the plurality of logic gates during the standby mode of the internal circuit block,
wherein the standby leakage reduction circuitry includes a plurality of latches, the plurality of latches including a latch corresponding to each of a plurality of inputs to the internal circuit block, the plurality of latches to apply a selected input vector to the plurality of inputs during the standby mode, application of the selected input vector to cause a stack effect in a first set of the plurality of logic gates.

21. The mobile computer system of claim 20 wherein each of the logic gates in the first set of the plurality of logic gates has one terminal coupled to a power supply voltage and one terminal coupled to a ground supply voltage.

22. The mobile computer system of claim 21 wherein, for a second, different set of the plurality of logic gates, application of the selected input vector causes each logic gate in the second set to have a logical low output, the standby leakage reduction circuitry further including a p-type leakage control transistor having one terminal coupled to a supply voltage and another terminal coupled to each of the logic gates in the second set, the p-type leakage control transistor to be turned off during the standby mode.

23. The mobile computer system of claim 22 wherein, for a third, different set of the plurality of logic gates, application of the selected input vector causes each logic gate in the third set to have a logical high output, the standby leakage reduction circuitry further including an n-type leakage control transistor having one terminal coupled to a supply voltage and another terminal coupled to each of the logic gates in the third set, the n-type leakage control transistor to be turned off during the standby mode.

24. An integrated circuit device comprising:

a means for reducing standby leakage current to be coupled to a circuit block that includes a plurality of logic gates, the means for reducing standby leakage current to cause a stack effect at each of the plurality of logic gates during a standby mode of the internal circuit block in response to an output state of each of the logic gates.

25. The integrated circuit device of claim 24 wherein the means for reducing standby leakage current includes
   a means for turning off a transistor in a pull-up path of each of the plurality of logic gates if the corresponding logic gate has a logical low output during the standby mode, and
   a means for turning off a transistor in the pull-down path of each of the plurality of logic gates if the corresponding logic gate has a logical high output during the standby mode.

26. An integrated circuit device comprising:
   a means for reducing standby leakage current to be coupled to a circuit block that includes a plurality of logic gates, the means for reducing standby leakage current to cause a stack effect at each of the plurality of logic gates during a standby mode of the internal circuit block,
   wherein the means for reducing standby leakage current includes
      a means for applying a selected input vector to inputs of the circuit block during the standby mode, application of the selected input vector to cause a stack effect in a first set of the plurality of logic gates,
      a means for causing the stack effect at a second, different set of the plurality of logic gates, the logic gates in the second set having a logical low voltage in response to application of the selected input vector, and
      a means for causing the stack effect at a third, different set of the plurality of logic gates, the logic gates in the third set having a logical high voltage in response to application of the selected input vector.

\* \* \* \* \*